United States Patent [19]

Ohata et al.

[11] Patent Number: 5,111,256
[45] Date of Patent: May 5, 1992

[54] HIGH SPEED SEMICONDUCTOR DEVICE AND AN OPTELECTRONIC DEVICE

[75] Inventors: Keiichi Ohata; Hikaru Hida, both of Tokyo, Japan

[73] Assignee: NEC Corporation, Tokyo, Japan

[21] Appl. No.: 457,588

[22] Filed: Dec. 27, 1989

[30] Foreign Application Priority Data

Dec. 27, 1988 [JP] Japan .............................. 63-334814
Mar. 28, 1989 [JP] Japan .................................. 1-77193

[51] Int. Cl.$^5$ .......................................... H01L 29/80
[52] U.S. Cl. ...................................... 357/22; 357/16; 357/15; 357/17
[58] Field of Search ............... 357/17, 22 A, 22 MD, 357/22 J, 30 B, 30 C, 30 D, 30 E, 30 I, 30 P, 16, 15, 92

[56] References Cited

U.S. PATENT DOCUMENTS

| | | | |
|---|---|---|---|
| 4,571,729 | 2/1986 | Fujimoto | 357/17 |
| 4,575,852 | 3/1986 | Fujimoto | 357/17 |
| 4,734,750 | 3/1988 | Okamura et al. | 357/30 E |
| 4,799,088 | 1/1989 | Hiyamizu et al. | 357/16 |
| 4,839,703 | 6/1989 | Ohata et al. | 357/15 |
| 4,905,059 | 2/1990 | Shur | 357/22 A |

FOREIGN PATENT DOCUMENTS

| | | | |
|---|---|---|---|
| 58-93380 | 6/1983 | Japan | 357/22 MD |
| 59-184573 | 10/1984 | Japan | 357/22 MD |
| 61-23364 | 1/1986 | Japan | 357/22 MD |
| 61-49476 | 3/1986 | Japan | 357/22 MD |
| 61-140181 | 6/1986 | Japan | 357/22 MD |
| 61-280674 | 12/1986 | Japan | 357/22 MD |
| 62-46564 | 2/1987 | Japan | 357/22 A |

OTHER PUBLICATIONS

Compound Semiconductor Device Handbook, published by Science Forum Co., Ltd., Japan (1986).

*Primary Examiner*—Rolf Hille
*Assistant Examiner*—Minhloan Tran
*Attorney, Agent, or Firm*—Burns, Doane, Swecker & Mathis

[57] ABSTRACT

A semiconductor device comprising a first semiconductor layer, a second semiconductor layer on the first layer, a source electrode and a drain electrode both in contact with the first layer, and a hole or electron injection electrode and a gate electrode both formed on the second layer; wherein the second semiconductor is one that has an electron affinity smaller than the first semiconductor when holes are injected or has a sum of an electron affinity and a band gap greater than the first semiconductor when electrons are injected; and wherein the injection electrode and the gate electrode are placed between the source electrode and the drain electrode in this order. In such device, the current driving capability can easily be increased by controlling the injection amount of holes or electrons and the current modulation can easily be controlled by a small capacitance gate electrode; and so operation at an extra-high frequency and an extra-high speed becomes possible.

12 Claims, 3 Drawing Sheets

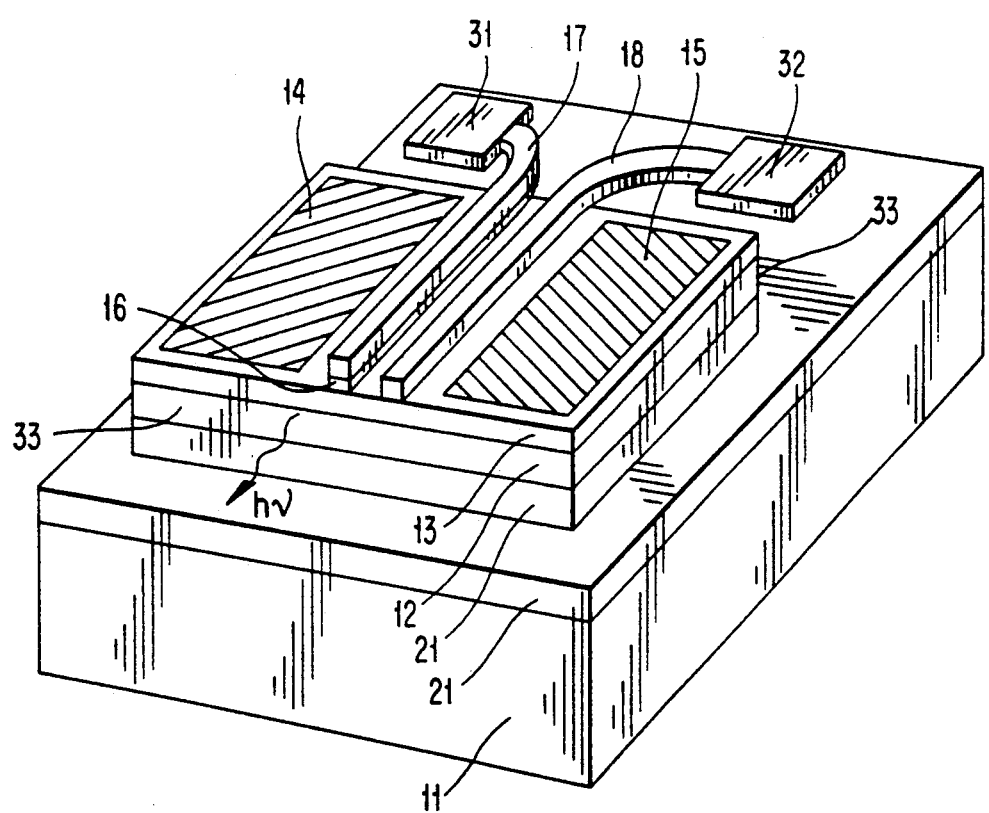

HIGH SPEED SEMICONDUCTOR DEVICE AND AN OPTELECTRONIC DEVICE

BACKGROUND OF THE INVENTION

1. Field of the Invention

The present invention relates to a semiconductor device which is operable at an extra-high frequency and an extra-high speed.

2. Description of the Prior Art

Up to the present, as a semiconductor device operable at an extra-high frequency and an extra-high speed, there have been a schottky gate field effect transistor (MESFET) using a compound semiconductor such as GaAs, and two dimensional electron gas FET using n-AlGaAs/GaAs hetero junction, as described for example in a Japanese book "Compound semiconductor device handbook" published from Science Forum Co., Ltd., Japan (1986). Such FETs however have poor capability of driving a large current and a relatively large source resistance, which limit their high frequency and IC. For example, in the MESFET, increase of carrier density in a channel is limited by lowering of gate breakdown voltage allowance and, in the two dimensional electron gas FET, the maximum electron density is smaller and further reduction of electron density and instabilities occur at a low temperature owing to n-type doping of AlGaAs which causes many traps of, what is called, DX centers.

SUMMARY OF THE INVENTION

An object of the present invention is therefore to solve the above problems of the prior art FETs and to present a novel extra-high frequency and extra-high speed semiconductor device having a higher performance and also a novel optoelectronic integrated circuit.

Thus the present invention provides a semiconductor device comprising:

(a) a substrate, (b) a first layer of an undoped first semiconductor material formed on the substrate, (c) a second layer of an undoped second semiconductor material formed on said first layer, said second semiconductor material having an electron affinity smaller than that of said first semiconductor material, (d) a source electrode and a drain electrode respectively formed in contact with said first layer, and (e) a hole injection electrode and a gate electrode respectively formed on said second layer between said source electrode and said drain electrode in this order.

According to the semiconductor device of the present invention as above, holes are injected from said hole injection electrode into said undoped second and first semiconductor layers, wherein electrons are then induced in order to keep electric charge neutrality. These electrons are stored in the first semiconductor layer having the greater electron affinity to form a channel layer. Since the electron density of this channel layer can be controlled by the injection amount of the holes, it becomes possible to easily increase the current driving capability. Further, the current flowing this channel can be controlled by the gate electrode of a small capacitance provided between the injection electrode and the drain electrode, and so excellent extra-high frequency and extra-high speed operation can be made and various functions can be realized.

By replacing said second semiconductor material having an electron affinity smaller than that of said first semiconductor material by a second semiconductor material having a sum of an electron affinity and a band gap greater than that of said first semiconductor material, and replacing said hole injection electrode by an electron injection electrode, said device of the present invention can be used for inducing holes in place of electrons in the channel layer.

Further, by interposing a third layer of a third semiconductor material having an electron affinity smaller than that of the first semiconductor material and having a sum of an electron affinity and a band gap greater than that of the first semiconductor material, between the substrate and said first semiconductor layer, it is possible to prevent the holes and electrons from scattering away to the substrate side and thus to improve a carrier storing effect in the channel layer.

Moreover, it is possible to form a light emitting device by utilizing a recombination luminescence of the injected and induced holes and electrons. By controlling flow of the induced channel to the drain electrode by the gate electode, the amount of the recombination luminescence can be modulated. Thus a luminescence controlled integrated device can be formed.

By using as said second semiconductor material having an electron affinity smaller than that of said first semiconductor material, a semiconductor material also having a·sum of an electron affinity and a band gap smaller than that of said first semiconductor material, said first semiconductor layer stands as a barrier to the holes injected from the hole injection electrode into said second semiconductor layer and so the holes are stored in said second semiconductor layer side of the heterointerface between the first and the second semiconductor layers. In response thereto, electrons are induced in order to keep the electric charge neutrality. These electrons are stored in said first semiconductor layer having a lower energy and form a channel. The electron density of this channel can be controlled by the injection amount of the holes. Since the holes and the electrons are stored separately in either side of the hetero-interface, it is possible to increase the current driving capability quite efficiently. Further the current of this channel can be controlled by the gate electrode of a small capacitance provided between the injection electrode and the drain electrode, excellent extra-high frequency and extra-high speed operation can be made.

By replacing said second semiconductor material having an electron affinity and a sum of an electron affinity and a band gap both of which are smaller than those of said first semiconductor material by a second semiconductor material having an electron affinity and a sum of an electron affinity and a band gap both of which are greater than those of said first semiconductor material, and by replacing said hole injection electrode by an electron injection electrode, it is possible to inject electrons and thereby to store them in the second semiconductor layer side of the hetero-interface and to induce the holes in the opposite side of the hetero-interface.

Further, by interposing a third layer of a third semiconductor material having an electron affinity smaller than that of the first semiconductor material or having a sum of an electron affinity and a band gap greater than that of the first semiconductor material, between the substrate and said first semiconductor layer, it is possible to form a barrier against the carrier in the channel layer and thereby to improve a carrier storing effect.

BRIEF DESCRIPTION OF THE DRAWINGS

FIG. 5 is a perspective view showing a principal structure of the semiconductor device according to still another embodiment of the present invention.

DESCRIPTION OF THE PREFERRED EMBODIMENTS

The present invention will be explained below further in detail with respect to its some embodiments shown as working examples.

EXAMPLE 1

Figure 1:
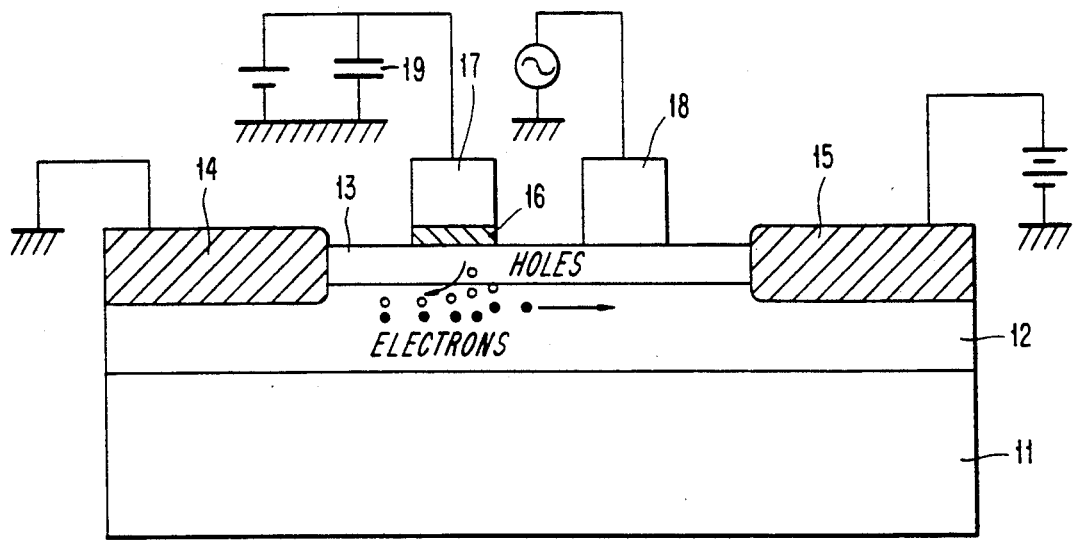
FIG. 1 is a sectional view showing a principal structure and operation of the semiconductor device according to an embodiment of the present invention.

An embodiment of the semiconductor device according to the present invention is shown in FIG. 1 by a sectional view. In this embodiment, the semiconductor device comprises a high resistance substrate 11 such as a semi-insulating GaAs substrate, a first layer 12 of an undoped first semiconductor material such as $-$GaAs (of a carrier density less than $1 \times 10^{14}$ cm$^{-3}$), a second layer 13 of an undoped second semiconductor material such as $-$Al$_{0.3}$Ga$_{0.7}$As (of a carrier density less than $1 \times 10^{15}$ cm$^{-3}$) having an electron affinity 0.3 eV smaller than said GaAs, ohmic electrodes 14 and 15 respectively as a source and a drain, a p$^+$ semiconductor layer 16 such as p$^+$ $-$GaAs or p$^+$ $-$Al$_{0.3}$Ga$_{0.7}$As (of a carrier density approximately $2 \times 10^{19}$ cm$^{-3}$), a metal electrode 17 such as Al electrode (these 16 and 17 together forming a hole injection electrode) and a gate electrode 18 such as Al electrode.

The semiconductor device shown in FIG. 1 operates in the following manner. As shown in FIG. 1, the source electrode 14 is grounded and a positive voltage is applied to the hole injection electrode 17 and the drain electrode 15 as a bias. First, holes are injected from the hole injection electrode 17 into the second and the first semiconductor layers 13 and 12, electrons are induced to keep electric charge neutrality, since these semiconductor layers are undoped. The induced electrons are stored in the first semiconductor layer side having a greater electron affinity. As the injection amount of the holes is increased, the storage of the electron is increased accordingly. Thus in a region from the hole injection electrode 17 to the source electrode 14, an extremely large amount of carriers are stored and at the same time an extremely low resistance condition is realized. The stored electrons are accelerated by the positive voltage applied to the drain electrode 15 and flow as a drain current, which is controllable by the insulated gate type gate electrode 18 using the second semiconductor layer 13 as an insulating layer. This device is featured by the fact that the maximum drain current and the variation of the current can independently be controlled, the former by the injection amount of the holes, that is, the bias applied to the hole injection electrode 17 and the latter by the gate electrode 18. Since the hole injection electrode 17 by itself has a large capacitance for applying a sufficient forward bias, but the gate electrode 18 for inputting control signals is an insulated gate type and so has a small capacitance, the device is extremely advantageous for high frequency and high speed operation. The source resistance is very small as mentioned above, but by grounding the hole injection electrode 17 under a high frequency condition, for example, by means of a capacitor 19 as shown in FIG. 1, the hole injection electrode 17 itself substantially works as a source and so such device is further advantageous. The thickess of the second semiconductor layer 13 in a region under the gate electrode 18 may not necessarily be equal to the thickness in the other regions and may be thinned for example by etching.

EXAMPLE 2

The device shown in Example 1 can be modified for injecting electons and obtaining holes as a channel. For this, for example, a semi-insulating InP substrate is used as the substrate, InGaAs is used as the first semiconductor material, AlInAs, which has a greater sum of an electron affinity and a band gap, that is, a smaller energy of a valence band than the InGaAs, is used as the second semiconductor material, and a combination of an n$^+$ $-$AlInAs layer and a metal electrode such as Ti electrode is used as an electron injection electrode.

In this embodiment, holes are induced by injection of electrons and are stored in the InGaAs first semiconductor layer having a lower energy level of holes.

EXAMPLE 3

Figure 2:
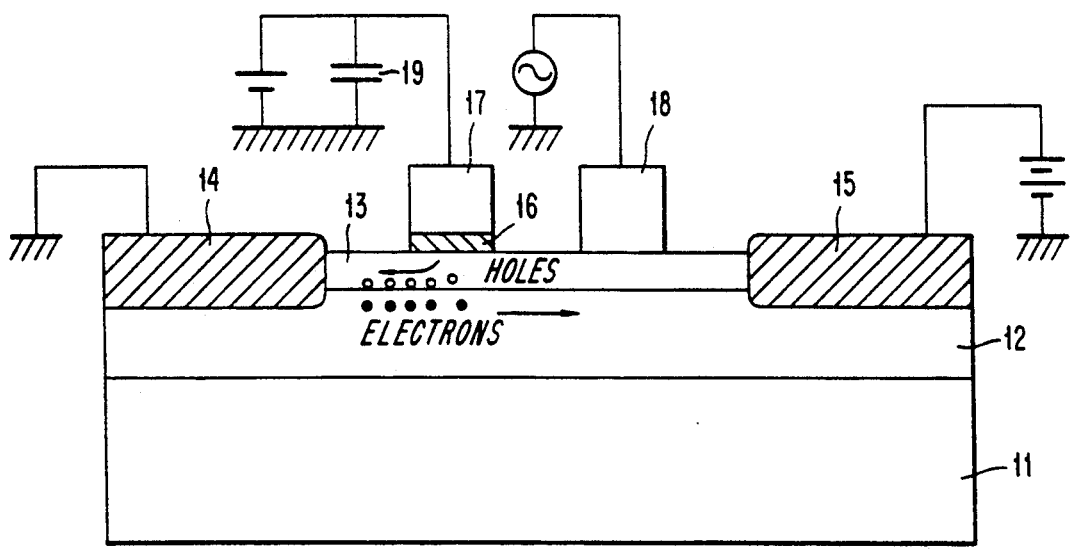
FIG. 2 is a sectional view showing a principal structure and operation of the semiconductor device according to another embodiment of the present invention.

Another embodiment of the semiconductor device according to the present invention is shown in FIG. 2 by a sectional view. In this embodiment, the semiconductor device comprises a high resistance substrate 11 such as a semi-insulating InP substrate, a first layer 12 of an undoped first semiconductor material such as InP (of a carrier density approximately $1 \times 10^{14}$ cm$^{-3}$), a second layer 13 of an undoped second semiconductor material such as Al$_{0.5}$In$_{0.5}$As (of a carrier density approximately $1 \times 10^{15}$ cm$^{-3}$) having an electron affinity 0.3 eV smaller than said InP and a sum of electron affinity and a band gap also smaller than said InP, ohmic electrodes 14 and 15 respectively as a source and drain, a p$^+$ semiconductor layer 16 such p$^+$ $-$Al$_{0.5}$In$_{0.5}$As (of a carrier density approximately $2 \times 10^{19}$ cm$^{-3}$), a metal electrode 17 such as Al electrode (these 16 and 17 together forming a hole injection electrode) and a gate electrode 18 such as Al electrode.

Figure 3:
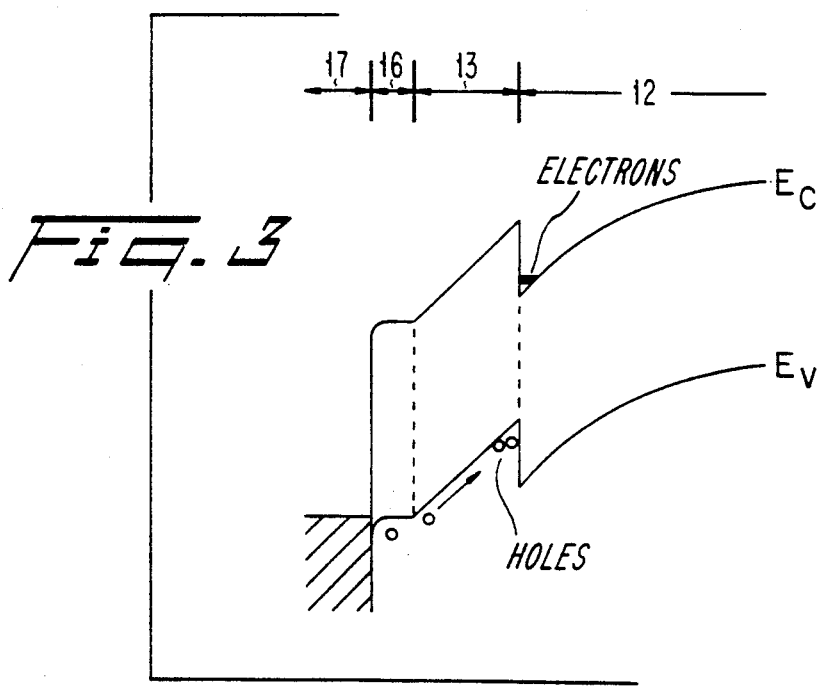
FIG. 3 is a diagram of energy band showing the principle of the embodiment of the present invention shown in FIG. 2.

The semiconductor device shown in FIG. 2 operates in the following manner. As shown in FIG. 1, the source electrode 14 is grounded and a positive voltage is applied to the hole injection electrode 17 and the drain electrode 15 as a bias. First, holes are injected from the hole injection electrode 17 into the second semiconductor layer 13. Referring to FIG. 3 which shows an energy band diagram in a region under the hole injection electrode 17 when holes are injected, it is understood that the injected holes are stored in a region from the hole injection electrode 17 to the source electrode 14 in the second semiconductor layer side of the hetero-interface between the first and the second semiconductor layers, since there is a barrier in a valence band owing to the first semiconductor layer at the hetero-interface. At that time, electrons are induced to keep electric charge neutrality and are stored in the first semiconductor layer side of the hetero-interface to form an electron channel, since the first semiconductor layer has a lower energy level in a conduction band. The stored electrons are accelerated by the positive voltage applied to the drain electrode 15 and flow as a drain current, which current is controllable by the insulated gate type gate electrode 18 using the second semiconductor layer 13 as an insulating layer. This device is featured by the fact that the electron density of the channel can be increased very efficiently in accordance with the injection amount of holes, since the holes are stored in the second semiconductor side and not scattered away to the substrate side and also the holes and the electrons are spacially separated to have least chances of recombination, and that the modulation of the drain current can be controlled independently by the gate electrode 18. Since the hole injection electrode 17 by itself has a large capacitance for applying a sufficient forward bias, but the gate electrode 18 for inputting control signals is an insulated gate type and so has a small capacitance, the device is extremely advantageous for high frequency and high speed operation. The source resistance is very small since an extremely large amount of carriers are stored in a region from the hole injection electrode 17 to the source electrode 14, but by grounding the hole injection electrode 17 under a high frequency condition, for example, by means of a capacitor 19 as shown in FIG. 2, the hole injection electrode 17 itself substantially works as a source and so such device is further advantageous. The thickness of the second semiconductor layer 13 in a region under the gate electrode 18 may not necessarily be equal to the thickness in the other regions and may be thinned for example by etching.

EXAMPLE 4

The device shown in Example 3 can be used for injecting electrons and obtaining holes as a channel. For this, for example, GaSb is used as the substrate and at the same time as the first semiconductor material, GaInAs, which has a greater electron affinity and also a greater sum of an electron affinity and a band gap than the GaSb, is used as the second semiconductor material, and a combination of an n+-GaInAs layer and a metal electrode such as Ti electrode is used as an electron injection electrode. In this embodiment, the injected electrons are stored in the GaInAs second semiconductor layer having a lower energy level of electrons and the induced holes are stored in the GaSb first semiconductor layer having a lower energy level of holes to form a p channel.

EXAMPLE 5

In the devices shown in the above Examples 1-4, it is possible to use a metal electrode formed on the second semiconductor layer with an interposed thin insulating film of such as $SiO_2$ therebetween as the hole or electron injection electrode.

EXAMPLE 6

Figure 4:
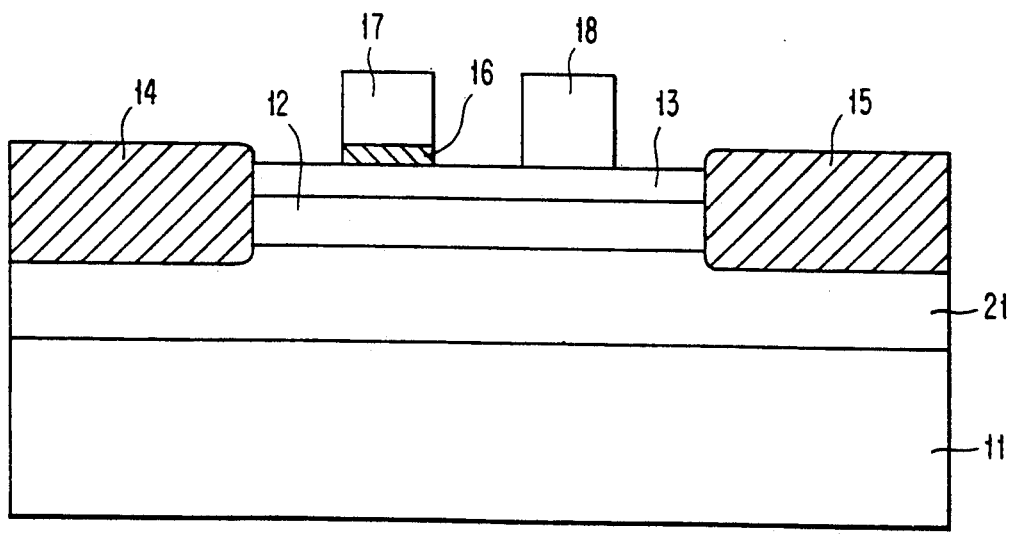
FIG. 4 is a sectional view showing a principal structure of the semiconductor device according to still another embodiment of the present invention.

Another embodiment of the present invention is shown in FIG. 4 by a sectional view. In this embodiment, a third layer 21 of a third semiconductor material which has an electron affinity smaller than that of the first semiconductor material and a sum of an electron affinity and a band gap greater than that of the first semiconductor material is interposed between the first semiconductor layer 12 and the substrate 11 in the device of the above Example 1 or 2. This third semiconductor layer 21 works as a barrier against both of electrons and holes in the first semiconductor layer, and so prevents scattering away of the injected holes or electrons to the substrate side and improves confinement of the induced electrons or holes. Thus the carrier storing effect can greatly be enhanced.

As for such third semiconductor material, it is possible to use, for example, undoped AlGaAs when the first semiconductor material is GaAs, or undoped AlInAs when the first semiconductor material as InGaAs.

EXAMPLE 7

Similarly to the above Example 6, it is possible to provide a third layer of a third semiconductor material in the device of the above Example 3 or 4. The third semiconductor material is one having an electron affinity smaller than that of the first semiconductor material in the case of the electron channel in the above Example 3 and is one having a sum of an electron affinity and a band gap greater than that of the first semiconductor material in the case of the hole channel in the above Example 4.

By this third semiconductor layer, it is possible to improve confinement of electrons or holes induced and stored in the first semiconductor layer and thus to greatly enchance the carrier storing effect as in the above Example 6.

As for such semiconductor material, it is possible to use, for example, undoped AlGaAs when the channel is the electron channel and the first semiconductor material is InP, or undoped AlInAsSb when the channel is the hole channel and the first semiconductor material is GaSb.

EXAMPLE 8

Another embodiment of the present invention is shown in FIG. 5 by a perspective view. In this embodiment, a laser diode or a light emitting diode is formed in a region from the hole or electron injection electrode to the source electrode in the device shown in the above example 6 and the optical output of the diode is controlled by the gate electrode.

Referring to FIG. 5, a laser diode is formed by a source electrode 14, a hole injection electrode 17 and an end surface mirror 33 formed perpendicularly to the surface of the semiconductor layers by dry etching or the like. The hole injection electrode 17 and a gate electrode 18 respectively are connected, for example by air bridges, to bonding pads 31 and 32 formed on a third semiconductor layer 21 of undoped AlGaAs or on a substrate 11 of GaAs. The other semiconductor layers may be same as those of the Example 6, that is, the first layer 12 of undoped GaAs, the second layer 13 of undoped AlGaAs and p+ layer 16 of p+GaAs. If a long laser wavelength band is to be constituted, for example, InGaAsP may be used for the first semiconductor layer 12, AlInAs may be used for the second semiconductor layer 13 and the p+ layer 16 and InP may be used for the third semiconductor layer 21 and the substrate 11.

As in the Example 6, the injected holes (or electrons) and the induced electrons (or holes) are confined, and so it is possible to pick up highly efficient luminescence by recombination from a region under the hole (or electron) injection electrode to the source electrode. The induced electrons are accelerated and run toward the drain electrode. By depressing the drain current, that is. the flow of the induced electrons toward the drain electrode. by the gate electrode. it is possible to increase the recombination and thus an optical output. This means that the optical output can be controlled by the gate voltage.

In a usual method of directly modulating a laser diode, a high speed operation is very difficult owing to a large capacitance of the diode. According to the above embodiment, however, the optical output can be controlled by a gate electrode of a small capacitance and so an extremely high speed modulation can be made. Further, it is apparent from the above explanation and FIG. 5, the system of light emitting and its driving and modulation can be realized by a very simple construction of an integrated device.

In the present invention, various combinations of the second/first/third semiconductors may be employed. They are for example:

in the case of the electron channel;
AlGaAs/GaAs/AlGaAs,
GaInP or AlGaInP/GaAs/AlGaAs,
GaAs/GaInAs/AlGaAs,
AlInAs/GaInAs/AlInAs,
InP/GaInAs/InP,
AlInAs/GaInAsP/InP,
InP/GaInAsP/InP,
AlInAs/InP/AlGaAs, or the like and
in the case of the hole channel;
AlGaAs/GaAs/AlGaAs,
GaInP/GaAs/AlGaInP,
InP/GaInAs/InP,
GaAs/Ge/AlGaAs,
GaInAs/GaSb/AlInAsSb, or the like.

Namely, semiconductors of various elements of the groups III-V, the group IV or the groups II-VI, can be used as long as the injection of electrons or holes is possible and the above explained conditions of the electron affinity and/or the sum of the electron affinity and the band gap are satisfied.

Further, the injection of electrons or holes can be made through an insulating film.

As explained above in detail, the present invention enables to realize a very high performance semiconductor or optoelectronic device operable at an extra-high frequency and an extra-high speed. Further, the device allows use of a large current and modulation by a small capacitance gate electrode. Such device is very useful for advancing performances and functions of a microwave and millimeter wave communication system, an optical communication system, or the like.

We claim:

1. A semiconductor device comprising;
(a) a substrate,
(b) a first layer of an undoped first semiconductor material formed on the substrate,
(c) a second layer of an undoped second semiconductor material formed on said first layer, said second semiconductor material having an electron affinity smaller than that of said first semiconductor material,
(d) a source electrode and a drain electrode respectively formed in contact with said first layer, and
(e) a hole injection electrode and a gate electrode respectively formed on said second layer between said source electrode and said drain electrode in this order,
said hole injection electrode being formed on said second layer with one of an interposed p⁻ semiconductor layer and an interposed thin insulating film.

2. The semiconductor device according to claim 1 wherein a third layer of a third semiconductor material having an electron affinity smaller than than of the first semiconductor material and a sum of an electron affinity and a band gap greater than that of the first semiconductor material is interposed between the substrate and said first layer.

3. The semiconductor device according to claim 2 wherein a laser diode is formed by a region between said hole injection electrode and said source electrode and an optical output of said diode is made controllable by said gate electrode.

4. The semiconductor device according to claim 2 wherein a light emitting diode is formed by a region between said hole injection electrode and said source electrode and an optical output of said diode is made controllable by said gate electrode.

5. The semiconductor device according to claim 1 wherein said second semiconductor material is one that has an electron affininty smaller than that of said first semiconductor material and a sum of an electron affinity and a band gap smaller than that of said first semiconductor material.

6. The semiconductor device according to claim 5 wherein a third layer of a third semiconductor material having an electron affinity smaller than that of the first semiconductor material is interposed between the substrate and said first layer.

7. A semiconductor device comprising:
(a) a substrate,
(b) a first layer of an undoped first semiconductor material formed on the substrate,
(c) a second layer of an undoped second semiconductor material formed on said first layer, said second semiconductor material having a sum of an electron affinity and a band gap greater than that of said first semiconductor material,
(d) a source electrode and a drain electrode respectively formed in contact with said first layer, and
(e) an electron injection electrode and a gate electrode respectively formed on said second layer between said source electrode and said drain electrode in this order,
said electron injection electrode being formed on said second layer with one of an interposed n⁺semiconductor layer and an interposed thin insulating film.

8. The semiconductor device according to claim 7 wherein a third layer of a third semiconductor material having an electron affinity smaller than that of the first semiconductor material and a sum of an electron affinity and a band gap greater than that of the first semiconductor material is interposed between the substrate and said first layer.

9. The semiconductor device according to claim 8 wherein a laser diode is formed by a region between said electron injection electrode and said source electrode and an optical outout of said diode is made controllable by said gate electrode.

10. The semiconductor device according claim 8 wherein a light emitting diode is formed by a region between said electron injection electrode and said source electrode and an optical output of said diode is made controllable by said gate electrode.

11. The semiconductor device according to claim 7 wherein said second semiconductor matorial is one that has a sum of an electron affinity and a band gap graater than that of said first semiconductor material and an electron affinity greater than that of said first semiconductor material.

12. The semiconductor device according to claim 11 wherein a third layer of a third semiconductor material having a sum of an electron affinity and a band gap greater than that of the first semiconductor material is interposed between the substrate and said first layer.

* * * * *